(12) United States Patent
Roque et al.

(10) Patent No.: US 10,635,768 B1
(45) Date of Patent: Apr. 28, 2020

(54) SYSTEM, METHOD, AND COMPUTER PROGRAM PRODUCT FOR DISPLAYING MULTIPLE TRACES WHILE DEBUGGING DURING A FORMAL VERIFICATION

(71) Applicant: Cadence Design Systems, Inc., San Jose, CA (US)

(72) Inventors: Thiago Radicchi Roque, Oakland, CA (US); Chien-Liang Lin, San Jose, CA (US); Guilherme Henrique de Sousa Santos, Belo Horizonte (BZ); Chung-Wah Norris Ip, Cupertino, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 83 days.

(21) Appl. No.: 15/881,166

(22) Filed: Jan. 26, 2018

(51) Int. Cl.
*G06F 17/50* (2006.01)

(52) U.S. Cl.
CPC ........ *G06F 17/504* (2013.01); *G06F 17/5022* (2013.01)

(58) Field of Classification Search
CPC .................................................... G06F 17/504

USPC ........................................................ 716/139
See application file for complete search history.

(56) References Cited

U.S. PATENT DOCUMENTS

| 7,421,668 | B1 | 9/2008 | Ip et al. |
| 7,506,288 | B1 | 3/2009 | Ip et al. |
| 8,103,999 | B1* | 1/2012 | Martensson .......... G06F 17/504 716/106 |
| 8,863,049 | B1 | 10/2014 | Lundgren et al. |

* cited by examiner

*Primary Examiner* — Suresh Memula
(74) *Attorney, Agent, or Firm* — Mark H. Whittenberger, Esq.; Holland & Knight LLP

(57) ABSTRACT

The present disclosure relates to a method for electronic design. Embodiments may include receiving, using a processor, an electronic design and performing formal verification upon at least a portion of the electronic design for a specific problem statement. Embodiments may further include generating a plurality of traces associated with the formal verification satisfying the specific problem statement and displaying, at a graphical user interface, an option to select at least one of the plurality of traces for display at the graphical user interface while the formal verification is performed.

20 Claims, 13 Drawing Sheets

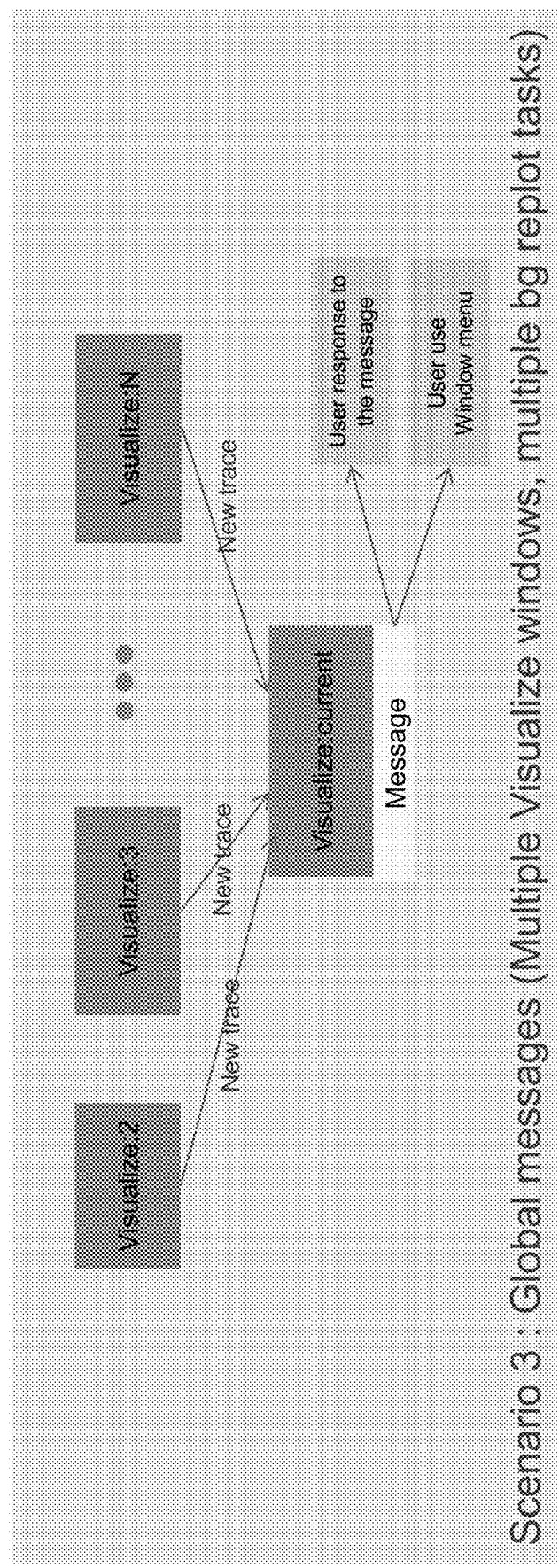

SYSTEM, METHOD, AND COMPUTER PROGRAM PRODUCT FOR DISPLAYING MULTIPLE TRACES WHILE DEBUGGING DURING A FORMAL VERIFICATION

FIELD OF THE INVENTION

The present disclosure relates to electronic design, and more specifically, to a method for debugging in an electronic design.

DISCUSSION OF THE RELATED ART

Over the last 30 years, the complexity of integrated circuits has increased greatly. This increase in complexity has exacerbated the difficulty of verifying circuit designs. In a typical integrated circuit design process, which includes many steps, the verification step consumes approximately 70-80% of the total time and resources. Aspects of the circuit design such as time-to-market and profit margin greatly depend on the verification step. As a result, flaws in the design that are not found during the verification step can have significant economic impact by increasing time-to-market and reducing profit margins. To maximize profit, therefore, the techniques used for verification should be as efficient as possible.

As the complexity in circuit design has increased, there has been a corresponding improvement in various kinds of verification and debugging techniques. In fact, these verification and debugging techniques have evolved from relatively simple transistor circuit-level simulation (in the early 1970s) to logic gate-level simulation (in the late 1980s) to the current art that uses Register Transfer Language (RTL)-level simulation. RTL describes the registers of a computer or digital electronic system and the way in which data are transferred among the combinational logic between registers.

Existing verification and debugging tools are used in the design flow of a circuit. The design flow begins with the creation of a circuit design at the RTL level using RTL source code. The RTL source code is specified according to a Hardware Description Language (HDL), such as Verilog HDL or VHDL. Circuit designers use high-level hardware description languages because of the size and complexity of modern integrated circuits. Circuit designs are developed in a high-level language using computer-implemented software applications, which enable a user to use text-editing and graphical tools to create a HDL-based design.

An increasingly popular technique is to use formal methods to verify the properties of a design completely. Formal methods use mathematical techniques to prove that a design property is either always true or to provide an example condition (called a counterexample) that demonstrates the property is false. Tools that use formal methods to verify RTL source code and design properties are known as "model checkers." Design properties to be verified include specifications and/or requirements that must be satisfied by the circuit design. Since mathematical properties define the design requirements in pure mathematical terms, this enables analysis of all possible valid input sequences for a given circuit and is akin to an exhaustive simulation. Formal verification methods are therefore exhaustive, when compared for example to simulation methods, and they may provide many benefits, such as reduced validation time, quicker time-to-market, reduced costs, and high reliability.

Formal verification involves heavy mathematical computation, and traditional formal verification tools place a heavy emphasis on automation. Therefore, users typically let their formal verification tools run in a batch mode instead of interactively, frequently waiting overnight for the complex analysis to finish. But the lack of interactivity leaves the designer's insights into the design out of the process, ultimately making the formal verification less effective.

In existing approaches users run the formal proof to get a list of failed properties. The proof engines can provide the counter example to the user in order to debug the failures in an electronic design automation environment. The user may apply constraints on the current waveform to create a new alternate waveform. If the new waveform fails some existing properties, the user may debug these failures.

In existing systems, when users are looking for traces for a particular portion of a formal verification, if the proof run is producing multiple traces, the user cannot begin debugging these traces as soon as they become available. They are forced to wait until the end of the proof run to be able to look at the resulting traces and debug them, which may take an excessive amount of time. Further, the user can only look at the last trace produced, as all the other traces are thrown out.

SUMMARY OF DISCLOSURE

In one or more embodiments of the present disclosure, a computer-implemented method is provided. The method may include receiving, using a processor, an electronic design and performing formal verification upon at least a portion of the electronic design for a specific problem statement. The method may further include generating a plurality of traces associated with the formal verification satisfying the specific problem statement and displaying, at a graphical user interface, an option to select at least one of the plurality of traces for display at the graphical user interface while the formal verification is performed.

One or more of the following features may be included. In some embodiments, the method may include providing, at the graphical user interface, a notification of a new trace during the formal verification. The method may further include allowing a user to select the new trace for display during the formal verification. In some embodiments, the plurality of traces may include a quiet trace, and wherein the plurality of traces includes an initial trace, at least one intermediate trace, and a final trace, all satisfying one or more requirements that were initially provided to a formal engine, each of the plurality of traces having different levels of quietness. The method may include allowing a user to select between multiple portions of the graphical user interface to display the new trace. The method may also include selecting one intermediate trace and storing the one intermediate trace while overwriting one or more remaining intermediate traces. The method may further include storing the plurality of traces using one or more databases. The method may also include displaying a selected trace without altering a current proof associated with the formal verification.

In one or more embodiments of the present disclosure a computer-readable storage medium having stored thereon instructions, which when executed by a processor result in one or more operations is provided. Operations may include receiving, using a processor, an electronic design and performing formal verification upon at least a portion of the electronic design for a specific problem statement. Operations may further include generating a plurality of traces associated with the formal verification satisfying the specific problem statement and displaying, at a graphical user interface, an option to select at least one of the plurality of traces for display at the graphical user interface while the formal verification is performed.

One or more of the following features may be included. In some embodiments, the method may include providing, at the graphical user interface, a notification of a new trace during the formal verification. Operations may further include allowing a user to select the new trace for display during the formal verification. In some embodiments, the plurality of traces may include a quiet trace, and wherein the plurality of traces includes an initial trace, at least one intermediate trace, and a final trace, all satisfying one or more requirements that were initially provided to a formal engine, each of the plurality of traces having different levels of quietness. Operations may include allowing a user to select between multiple portions of the graphical user interface to display the new trace. Operations may also include selecting one intermediate trace and storing the one intermediate trace while overwriting one or more remaining intermediate traces. Operations may further include storing the plurality of traces using one or more databases. Operations may also include displaying a selected trace without altering a current proof associated with the formal verification.

In one or more embodiments of the present disclosure, a system is provided. The system may include at least one processor configured to receive an electronic design and to perform formal verification upon at least a portion of the electronic design for a specific problem statement. The at least one processor may be further configured to generate a plurality of traces associated with the formal verification satisfying the specific problem statement. The at least one processor may be further configured to display, at a graphical user interface, an option to select at least one of the plurality of traces for display at the graphical user interface while the formal verification is performed.

One or more of the following features may be included. In some embodiments, the at least one processor may be further configured to provide, at the graphical user interface, a notification of a new trace during the formal verification. The at least one processor may be further configured to allow a user to select the new trace for display during the formal verification. The plurality of traces may include a quiet trace, and wherein the plurality of traces includes an initial trace, at least one intermediate trace, and a final trace, all satisfying one or more requirements that were initially provided to a formal engine, each of the plurality of traces having different levels of quietness.

Additional features and advantages of embodiments of the present disclosure will be set forth in the description which follows, and in part will be apparent from the description, or may be learned by practice of embodiments of the present disclosure. The objectives and other advantages of the embodiments of the present disclosure may be realized and attained by the structure particularly pointed out in the written description and claims hereof as well as the appended drawings.

It is to be understood that both the foregoing general description and the following detailed description are exemplary and explanatory and are intended to provide further explanation of embodiments of the invention as claimed.

BRIEF DESCRIPTION OF THE DRAWINGS

The accompanying drawings, which are included to provide a further understanding of embodiments of the present disclosure and are incorporated in and constitute a part of this specification, illustrate embodiments of the present disclosure and together with the description serve to explain the principles of embodiments of the present disclosure.

FIG. 13 is a diagram depicting an embodiment in accordance with the present disclosure.

DETAILED DESCRIPTION

Figure 1:
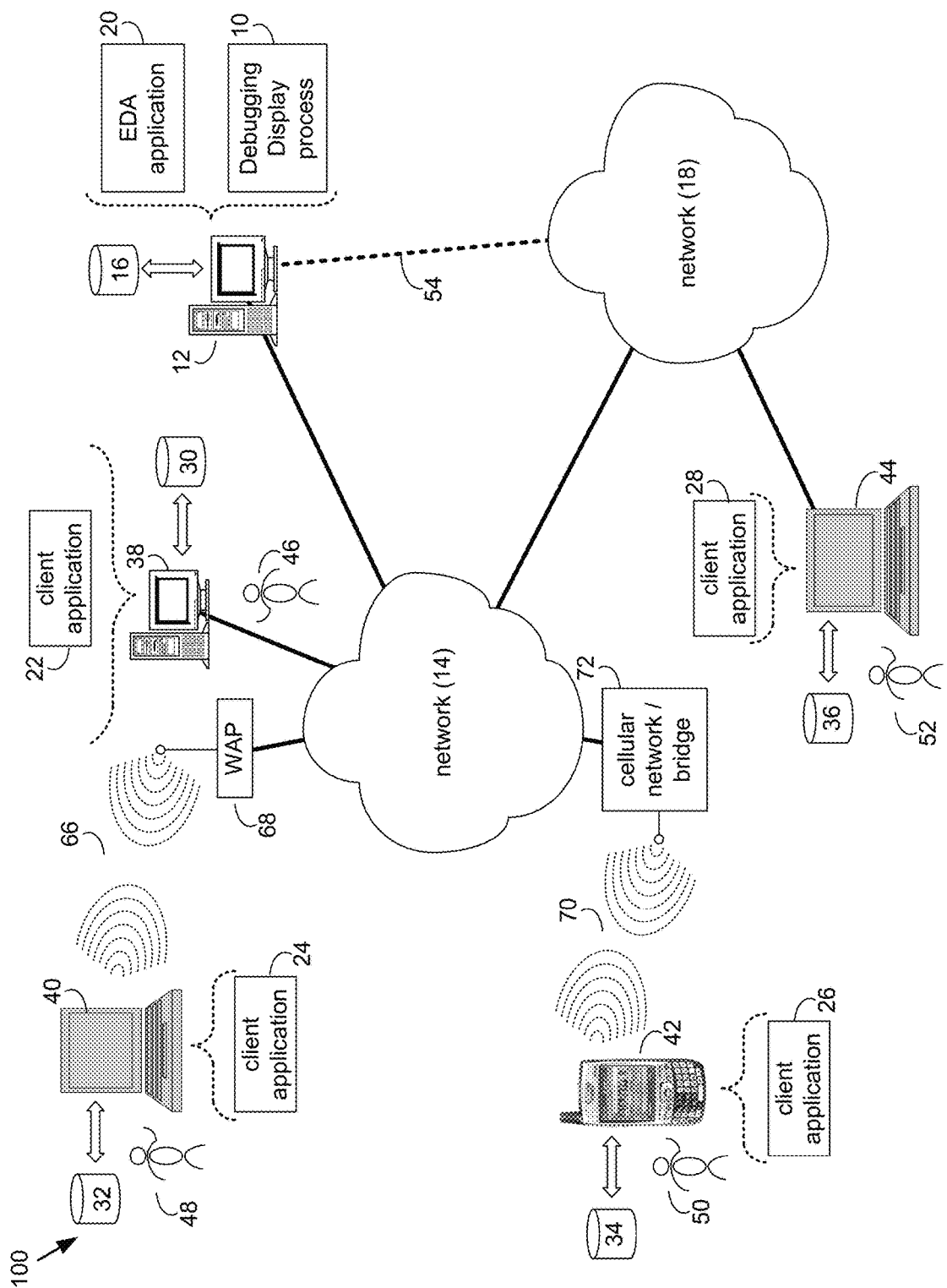
FIG. 1 is a diagram depicting an embodiment of a system in accordance with the present disclosure.

Reference will now be made in detail to the embodiments of the present disclosure, examples of which are illustrated in the accompanying drawings. The present disclosure may, however, be embodied in many different forms and should not be construed as being limited to the embodiments set forth herein. Rather, these embodiments are provided so that this disclosure will be thorough and complete, and will fully convey the concept of the disclosure to those skilled in the art.

As will be appreciated by one skilled in the art, the present disclosure may be embodied as a method, system, or computer program product. Accordingly, the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present disclosure may take the form of a computer program product on a computer-usable storage medium having computer-usable program code embodied in the medium.

As used in any embodiment described herein, "circuitry" may include, for example, singly or in any combination, hardwired circuitry, programmable circuitry, state machine circuitry, and/or firmware that stores instructions executed by programmable circuitry. It should be understood at the outset that any of the operations and/or operative components described in any embodiment herein may be implemented in software, firmware, hardwired circuitry and/or any combination thereof.

Any suitable computer usable or computer readable medium may be utilized. The computer readable medium may be a computer readable signal medium or a computer readable storage medium. A computer-usable, or computer-readable, storage medium (including a storage device associated with a computing device or client electronic device) may be, for example, but not limited to, an electronic, magnetic, optical, electromagnetic, infrared, or semiconductor system, apparatus, or device, or any suitable combination of the foregoing. More specific examples (a non-exhaustive list) of the computer-readable medium may include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device. In the context of this document, a computer-usable, or computer-readable, storage medium may be any tangible medium that can contain, or store a program for use by or in connection with the instruction execution system, apparatus, or device.

A computer readable signal medium may include a propagated data signal with computer readable program coded embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations of the present invention may be written in an object oriented programming language such as Java, Smalltalk, C++ or the like. However, the computer program code for carrying out operations of the present invention may also be written in conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through a local area network (LAN) or a wide area network (WAN), or the connection may be made to an external computer (for example, through the Internet using an Internet Service Provider).

The present disclosure is described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable memory that can direct a computer or other programmable data processing apparatus to function in a particular manner, such that the instructions stored in the computer-readable memory produce an article of manufacture including instructions which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions/acts specified in the flowchart and/or block diagram block or blocks.

One or more hardware description languages may be used in accordance with the present disclosure. Some hardware description languages may include, but are not limited to, Verilog, VHDL, SystemC, SystemVerilog and Verilog-AMS. Various other hardware description languages may also be used as well.

Referring to FIG. 1, there is shown a debugging display process 10 that may reside on and may be executed by server computer 12, which may be connected to network 14 (e.g., the Internet or a local area network). Examples of server computer 12 may include, but are not limited to: a personal computer, a server computer, a series of server computers, a mini computer, and a mainframe computer. Server computer 12 may be a web server (or a series of servers) running a network operating system, examples of which may include but are not limited to: Microsoft® Windows® Server; Novell® NetWare®; or Red Hat® Linux®, for example. (Microsoft and Windows are registered trademarks of Microsoft Corporation in the United States, other countries or both; Novell and NetWare are registered trademarks of Novell Corporation in the United States, other countries or both; Red Hat is a registered trademark of Red Hat Corporation in the United States, other countries or both; and Linux is a registered trademark of Linus Torvalds in the United States, other countries or both.) Additionally/alternatively, debugging display process 10 may reside on and be executed, in whole or in part, by a client electronic device, such as a personal computer, notebook computer, personal digital assistant, or the like.

The instruction sets and subroutines of debugging display process 10, which may include one or more software modules, and which may be stored on storage device 16 coupled to server computer 12, may be executed by one or more processors (not shown) and one or more memory modules (not shown) incorporated into server computer 12. Storage device 16 may include but is not limited to: a hard disk drive; a solid state drive, a tape drive; an optical drive; a RAID array; a random access memory (RAM); and a read-only memory (ROM). Storage device 16 may include various types of files and file types including but not limited, to hardware description language (HDL) files, which may contain the port type descriptions and executable specifications of hardware blocks.

Server computer 12 may execute a web server application, examples of which may include but are not limited to: Microsoft IIS, Novell Webserver™, or Apache® Webserver, that allows for HTTP (i.e., HyperText Transfer Protocol) access to server computer 12 via network 14 (Webserver is a trademark of Novell Corporation in the United States, other countries, or both; and Apache is a registered trademark of Apache Software Foundation in the United States, other countries, or both). Network 14 may be connected to one or more secondary networks (e.g., network 18), examples of which may include but are not limited to: a local area network; a wide area network; or an intranet, for example.

Server computer 12 may execute an electronic design automation (EDA) application (e.g., EDA application 20), examples of which may include, but are not limited to those available from the assignee of the present application. EDA application 20 may interact with one or more EDA client applications (e.g., EDA client applications 22, 24, 26, 28) for electronic design optimization.

Debugging display process 10 may be a stand alone application, or may be an applet/application/script that may interact with and/or be executed within EDA application 20. In addition/as an alternative to being a server-side process, debugging display process 10 may be a client-side process (not shown) that may reside on a client electronic device (described below) and may interact with an EDA client application (e.g., one or more of EDA client applications 22, 24, 26, 28). Further, debugging display process 10 may be a hybrid server-side/client-side process that may interact with EDA application 20 and an EDA client application (e.g., one or more of client applications 22, 24, 26, 28). As such, debugging display process 10 may reside, in whole, or in part, on server computer 12 and/or one or more client electronic devices.

The instruction sets and subroutines of EDA application 20, which may be stored on storage device 16 coupled to server computer 12 may be executed by one or more processors (not shown) and one or more memory modules (not shown) incorporated into server computer 12.

The instruction sets and subroutines of EDA client applications 22, 24, 26, 28, which may be stored on storage devices 30, 32, 34, 36 (respectively) coupled to client electronic devices 38, 40, 42, 44 (respectively), may be executed by one or more processors (not shown) and one or more memory modules (not shown) incorporated into client electronic devices 38, 40, 42, 44 (respectively). Storage devices 30, 32, 34, 36 may include but are not limited to: hard disk drives; solid state drives, tape drives; optical drives; RAID arrays; random access memories (RAM); read-only memories (ROM), compact flash (CF) storage devices, secure digital (SD) storage devices, and a memory stick storage devices. Examples of client electronic devices 38, 40, 42, 44 may include, but are not limited to, personal computer 38, laptop computer 40, mobile computing device 42 (such as a smart phone, netbook, or the like), notebook computer 44, for example. Using client applications 22, 24, 26, 28, users 46, 48, 50, 52 may access EDA application 20 and may allow users to e.g., utilize debugging display process 10.

Users 46, 48, 50, 52 may access EDA application 20 directly through the device on which the client application (e.g., client applications 22, 24, 26, 28) is executed, namely client electronic devices 38, 40, 42, 44, for example. Users 46, 48, 50, 52 may access EDA application 20 directly through network 14 or through secondary network 18. Further, server computer 12 (i.e., the computer that executes EDA application 20) may be connected to network 14 through secondary network 18, as illustrated with phantom link line 54.

The various client electronic devices may be directly or indirectly coupled to network 14 (or network 18). For example, personal computer 38 is shown directly coupled to network 14 via a hardwired network connection. Further, notebook computer 44 is shown directly coupled to network 18 via a hardwired network connection. Laptop computer 40 is shown wirelessly coupled to network 14 via wireless communication channel 66 established between laptop computer 40 and wireless access point (i.e., WAP) 68, which is shown directly coupled to network 14. WAP 68 may be, for example, an IEEE 802.11a, 802.11b, 802.11g, Wi-Fi, and/or Bluetooth device that is capable of establishing wireless communication channel 66 between laptop computer 40 and WAP 68. Mobile computing device 42 is shown wirelessly coupled to network 14 via wireless communication channel 70 established between mobile computing device 42 and cellular network/bridge 72, which is shown directly coupled to network 14.

As is known in the art, all of the IEEE 802.11x specifications may use Ethernet protocol and carrier sense multiple access with collision avoidance (i.e., CSMA/CA) for path sharing. The various 802.11x specifications may use phase-shift keying (i.e., PSK) modulation or complementary code keying (i.e., CCK) modulation, for example. As is known in the art, Bluetooth is a telecommunications industry specification that allows e.g., mobile phones, computers, and personal digital assistants to be interconnected using a short-range wireless connection.

Client electronic devices 38, 40, 42, 44 may each execute an operating system, examples of which may include but are not limited to Microsoft Windows, Microsoft Windows CE®, Red Hat Linux, or other suitable operating system. (Windows CE is a registered trademark of Microsoft Corporation in the United States, other countries, or both).

Figure 2:
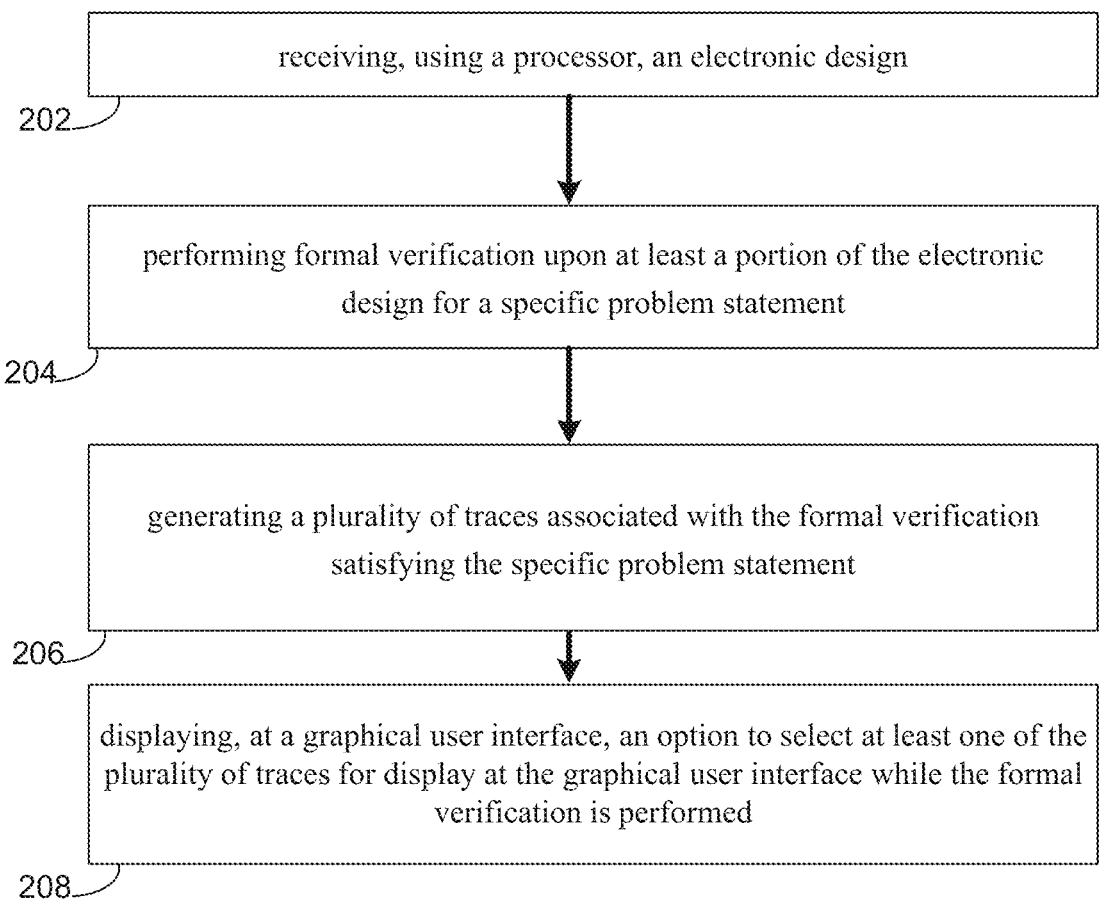
FIG. 2 is a flowchart depicting operations consistent with the debugging display process in accordance with an embodiment of the present disclosure.

Referring now to FIG. 2, an exemplary flowchart 200 depicting operations consistent with debugging display process 10 is provided. Operation may include receiving (202), using a processor, an electronic design and performing (204) formal verification upon at least a portion of the electronic design for a specific problem statement. Operations may further include generating (206) a plurality of traces associated with the formal verification satisfying the specific problem statement. Operations may also include displaying (208), at a graphical user interface, an option to select at least one of the plurality of traces for display at the graphical user interface while the formal verification is performed.

Figure 3:
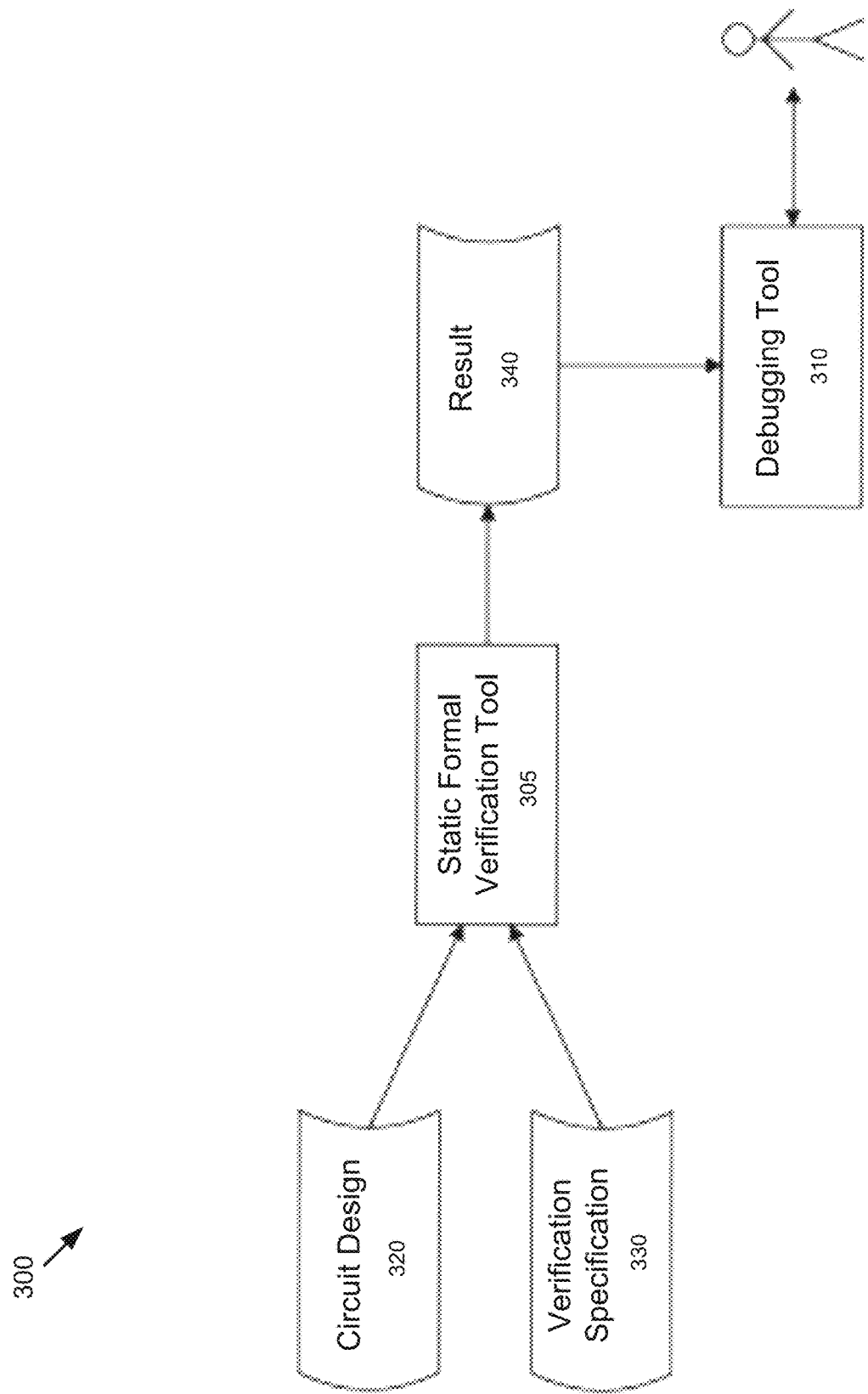
FIG. 3 is a diagram depicting an embodiment in accordance with the present disclosure.
Figure 4:
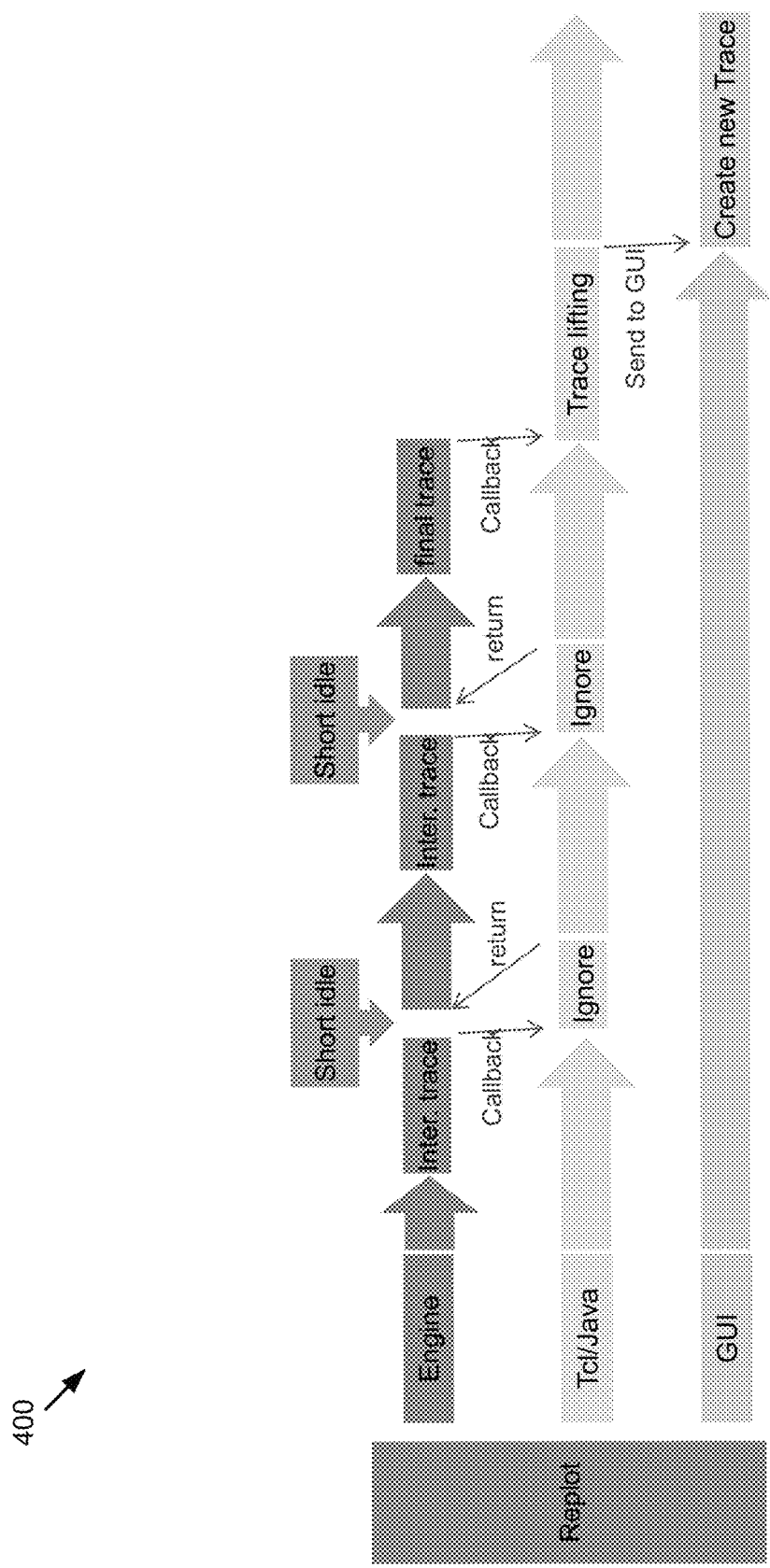
FIG. 4 is a diagram depicting an embodiment in accordance with the present disclosure.

Referring also to FIG. 3, an embodiment of a methodology for formal verification of a circuit design 320 is provided. The circuit design 320 may be embodied in a data file encoded using a hardware description language (HDL), which may describe the structural design and operation of a circuit. A set of requirements may be derived from a design specification for the circuit and then used to test whether the circuit design is compliant with the design specification. A user, such as a circuit designer or a verification engineer, may supply the requirements for the circuit design. The requirements may be encoded in a verification specification 330 as one or more properties and/or assumptions for the circuit design 320, encoded for example using Property Specification Language (PSL) or SystemVerilog Assertion (SVA). The verification specification 330 may be directly coded by a user or captured in an automated process. A property may be represented in the verification specification 330 as an assertion, where the assertion is satisfied if the property is true for all operating conditions of the circuit design 320. A property may also be represented in the verification specification 330 as a cover, where the cover is satisfied if the property is true for some operating condition of the circuit design 320. An assumption specifies that certain input signals to the circuit design may only take on pre-determined values (i.e., 0 or 1) at certain clock cycles when testing the circuit design against the property.

In a formal verification process, the verification tool 305 may receive a circuit design 320 and a verification specification 330 for testing the circuit design 320 against a set of requirements. The circuit design 320 and verification specification 330 may be represented in one or more files containing HDL code, which define a digital design and/or properties that give a functional specification of the design. The verification tool 305 may convert the inputs (i.e., the circuit design 320 and verification specification 330) into an internal representation using one or more data structures, such as a netlist. This conversion may comprise two different conversions: (1) synthesis of the input circuit design 320, and (2) property compilation of the properties in the verification specification 330.

The results of the design synthesis and the property compilation may then be combined into a common problem instance that is given as input to a model checker in the verification tool 305. The verification tool 305 then performs formal verification on the circuit design 320 using the statically allocated data structure. For assertions, during the formal verification process, the model checker attempts to determine whether there is a possible behavior of the circuit design 320 where one of the properties in the verification specification 330 are not true, which is called a counterexample for the property. If it is determined that no counterexample exists for a property, the property is said to be proven. The results 340 of the formal verification process thus comprise an indication of whether one or more of the properties are satisfied, and if not, the counterexample showing a condition under which the property fails. The counterexample includes a sequence of values for signals (input, internal, or output) of the circuit design over a number of clock cycles that satisfy the given assumptions but result in the property failure.

The verification of a cover may proceed in a similar way. In one embodiment, for a cover, the verification tool attempts to determine whether there is a possible behavior of the circuit design that satisfies the cover, which is called a cover trace. This cover trace includes a sequence of values for signals of the circuit design over a number of clock cycles that satisfy the given assumption and satisfy the cover.

The verification tool 305 outputs the result 330 of the verification process, which may be stored in memory, passed along to another software process, or displayed to the user. The result may comprise a counterexample if the circuit design 320 fails to meet the properties encoded in the verification specification or a witness if the design 320 satisfies the properties (e.g., the witness can be a cover trace). A debugging tool 310 may also be included to display the counterexample or witness to a circuit designer in a useful way to the designer. In one embodiment, the debugging tool 310 accepts the circuit design 320, verification specification 330, and result 340 as inputs and applies one or more soft constraints to the result 340 to create a quieter trace. This can facilitate understanding of what aspect of the HDL code in the circuit design 320 is responsible for the counterexample to the property in question. The debugging tool 310 may include a viewer as well as editing software.

Embodiments of the invention provide a debugging tool 310 that helps the circuit designer understand counterexamples that are identified during a formal verification process, and thereby more easily debug the circuit design when counterexamples are found. In operation, debugging tool 310 first receives the results from the verification tool 305 and presents them to the user. In other embodiments, the results may be received from a source other than the verification tool 305. The user may choose a counterexample to analyze, and the debugging tool 310 receives this user selection of which counterexample to analyze. The debugging tool 310 may also present a trace of the counterexample to the user by displaying the individual signals of the counterexample in a waveform over a finite number of clock cycles.

The debugging tool 310 may then receive a user input instructing the debugging tool 310 to apply one or more soft constraints. A soft constraint is a preference that the counterexample should satisfy if possible, but does not necessarily need to satisfy. In one embodiment, soft constraints help in debugging a counterexample by suppressing irrelevant aspects of the trace that do not contribute to the violation of the property, thereby simplifying the appearance of the trace when displayed as a waveform. Example soft constraints include a preference for setting the value of all input signals to the circuit design to logic 0 or setting the value of all input signals to logic 1, subject to the condition that changing the value does not affect the property violation. Another type of soft constraint is a preference for reducing the overall activity (i.e., number of signal transitions) of signals in the counterexample regardless of whether the signal values should be set to logic 0 or logic 1, subject to the condition that changing the value does not affect the property violation. Constraints can also be defined to apply to input signals, internal design signals, arbitrary HDL expressions, and temporal SVA expressions.

Soft constraints are in contrast to hard constraints. Soft constraints are conditional preferences that do not necessarily need to be satisfied by the counterexample trace. For example, a constraint of "set signal A to 1 only if property P is still violated" is a soft constraint. By contrast, hard constraints are strict requirements that must satisfied by the counterexample trace. For example, a constraint of "set signal A to 1" has no limitations and is a hard constraint. The circuit design and its assumptions are the primary source of hard constraints because they define strict requirements that cannot be avoided.

In one embodiment, the user input comprises a user input that identifies one or more soft constraints for the debugging tool 310 to apply. For example, the user input may select a specific soft constraint from a list of soft constraints presented to the user. As another example, the user may enter a logical expression that defines a soft constraint, which is then received by the debugging tool 310 as a user input. In another embodiment, the debugging tool 310 may be configured to apply a default soft constraint, and the user input triggers the application of the default soft constraint.

The debugging tool 310 may then applies the soft constraints to the counterexample trace to generate an updated trace. Some soft constraints may be applied to all signals and all clock cycles in the counterexample, whereas other soft constraints may be applied to only a sub-set of the signals, clock cycles, or signal-cycle pairs. In one embodiment, a user marks certain signals or clock cycles as active, which is received by the debugging tool 310 as a user input. The debugging tool 310 applies the soft constraints only to the portions of the trace marked as active. The active portion of the trace may also be set according to a default configuration (e.g., all cycles active) when there is no user input specifying how the soft constraints should be applied.

In one embodiment, the debugging tool 310 applies the soft constraints to as many signal-cycle pairs as possible within the active portion of the trace. Each signal-cycle pair is considered to be independent of the other signal-cycle pairs. In other words, a soft constraint can be satisfied for a signal-cycle pair regardless of whether the soft constraint can be satisfied for another signal-cycle pair on the same signal. For example, if clock cycle 1 of a signal A cannot satisfy a soft constraint, the debugging tool may still attempt to satisfy the soft constraint for clock cycle 2 of signal A. The application of soft constraints effectively removes aspects of the trace that do not contribute to the violation of the property, resulting in a trace that appears "quieter" and is easier to use in debugging the circuit design.

In one embodiment, the debugging tool 310 applies multiple soft constraints to the trace. When multiple soft constraints are involved, the soft constraints are prioritized. Higher priority constraints are generally satisfied at the expense of the lower priority constraints. As such, the debugging tool 310 only satisfies lower priority constraints if it does not result in the violation of a higher priority constraint. The priority for the soft constraints may be set according to a pre-determined configuration or set according to a user input defining the priority order.

After application of the soft constraints, the debugging tool 310 displays a waveform of the updated counterexample trace to a user of the debugging tool 310. In one embodiment, rather than displaying just the updated counterexample trace, the updated counterexample trace is displayed simultaneously with the original counterexample trace. This helps the circuit designer to understand of how the trace has changed as a result of applying the soft constraints. For example, a waveform for the updated counterexample may be displayed side-by-side with or overlaid on top of a waveform for the original counterexample. In another embodiment, a waveform of the updated counterexample is displayed along with markings on the waveform at specific signal-cycle pairs to indicate how the counterexample has changed as a result of applying the soft constraints.

In another embodiment, the debugging tool 310 displays a waveform for a partially updated trace before the debugging tool 310 finishes applying the soft constraints. Applying soft constraints can take a lengthy amount of time to complete, depending on the size and complexity of the circuit design, assumptions, properties, and soft-constraints. To increase the usability of the debugging tool 310 in these situations, the debugging tool 310 may display a waveform of a partially updated counterexample while the trace that best satisfies the soft constraints is being identified by the debugging tool 310. The partially updated counterexample may be displayed automatically according to a pre-defined configuration (e.g., whenever results are available) or in response to a user input requesting that it be displayed.

In a further embodiment, after the updated trace is displayed, the debugging tool 310 allows the user to apply new soft or hard constraints to the updated counterexample trace, thereby generating a sequence of counterexample traces. To maintain similarity with the current trace, the current trace may be used as a soft constraint in determining the next trace. This creates a preference for similarity with the current trace, subject to the condition that the property is still violated. The debugging tool 310 thus attempts to make the next trace as similar as possible to current trace when applying the new constraint. For example, if the new constraint is a hard constraint, the resulting waveform highlights the forced changes caused by the hard constraint while reducing unnecessary changes to other signal-cycle pairs. As another example, if the new constraint is a soft constraint, the new constraint can be given a high priority while the soft constraint that prefers similarity with the current trace is given a lower priority.

The debugging tool 310 also enables the user to jump between the traces in the sequence to compare differences between the traces. For example, the debugging tool 310 receives a user input selecting a trace for display. In response, the debugging tool 310 displays a waveform of the selected trace to the user. This enables the circuit designer to visualize how the trace changes on an incremental basis as new constraints are applied to the trace, which facilitates the process of debugging a circuit design. Additional information regarding formal verification techniques, including quiet trace approaches described above, may be found in U.S. Pat. Nos. 7,506,288 and 8,863,049, which are each incorporated herein by reference in their entirety.

As discussed above, in existing systems, when users are looking for traces for a Visualize Recipe, if the proof run is producing multiple traces, users can't start debugging these traces as soon as they become available. A Visualize Recipe may include a single target property, which can be an assertion or cover, and may also contain one or more hard constraints and soft constraints. The Visualize recipe allows the specification of special constraints called "force" and "at least once" constraints.

It should be noted that embodiments included herein may operate without a recipe, by using only the "single target property" as the problem formulation to the 305 static formal verification tool. For quiet trace, a soft constraint is typically necessary. For DBH and trace minimization, "single target property" is the minimal. Additional information regarding the concept of a visualize recipe may be found in U.S. Pat. No. 7,421,668, which is incorporated herein by reference in its entirety.

They have to wait until the end of the proof run to be able to look at the resulting traces and debug them, which is time consuming. Also, they can only look at the last trace produced, all the other traces are thrown out. The conventional cause is when users are trying to find a quiet trace for a Visualize Recipe. It may quickly deliver multiple traces during a single proof run, but when the traces are hard to find the process of finding the final quiet trace may take a very long time. This may prevent users from debugging the multiple intermediate results and potentially having to wait a long time to start debugging, since in its current form the tool will not allow users to debug anything until the proof run has completed.

Referring now to FIGS. 4-13, embodiments consistent with debugging display process 10 are provided. In some situations a proof run may deliver multiple traces for the same Visualize Recipe. Under existing approaches a user would have to wait until the proof run was finished and found the last trace to be able to visualize the result produced by the engines. However, using the teachings of the present disclosure users may debug multiple results as soon as they become available, while the proof continues to run, potentially finding more results. After the proof has finished, users are able to browse through the multiple traces that were delivered and debug them using various graphical interfaces such as those discussed in further detail hereinbelow.

Embodiments of debugging display process 10 may be configured to monitor the engine results, waiting for any traces to be found. When a trace is found debugging display process 10 may capture it and save it in a database such as those shown in FIG. 1. The system may be configured to notify the user that a trace has been found and may allow the user to debug this trace on the fly, by bringing it up using a separate thread, which may allow the engines to continue finding new traces and reporting them. When the last trace is found, the user may be notified and may be provided with the option to open it, keep it stored in the database, and/or open it at a later time. During the proof run and also after it has finished, debugging display process 10 may allow the user to navigate to any intermediate traces that have been opened for debugging.

Accordingly, debugging display process 10 may be configured to notify users of intermediate results immediately through a notification system associated with EDA application 20. Debugging display process 10 may allow for the opening of traces while the proofs continue to work in the background, therefore without impacting the performance of the proofs. Debugging display process 10 may also store the intermediate results in its database and allow the user to navigate through these results at any point in time during the proof or after it.

Referring again to FIG. 4, a diagram 400 showing an example consistent with existing systems is provided. In this example, a formal engine may locate the initial trace and then iteratively create better or alternate traces. In this example, a user will not be able to see any trace until a fully-optimized trace is available. Here, the formal engine is not blocked by the Tcl/Java thread, which performs trace lifting when a final trace is sent by the formal engine. As is shown in the Figure, there is no reporting to the graphical user interface during any of the intermediate trace operations.

As used herein, the phrase "trace lifting" may refer to the operation of expanding a formal engine trace to contain values for all signals in the cone of influence of the Visualize Recipe, since originally the engine trace will only contain values for a subset of primary inputs, undriven signals and some register initial values. This trace expansion may be performed by using the formal engine trace as input stimulus to a simulation process executed on the cone of influence of the Visualize Recipe.

Figure 5:
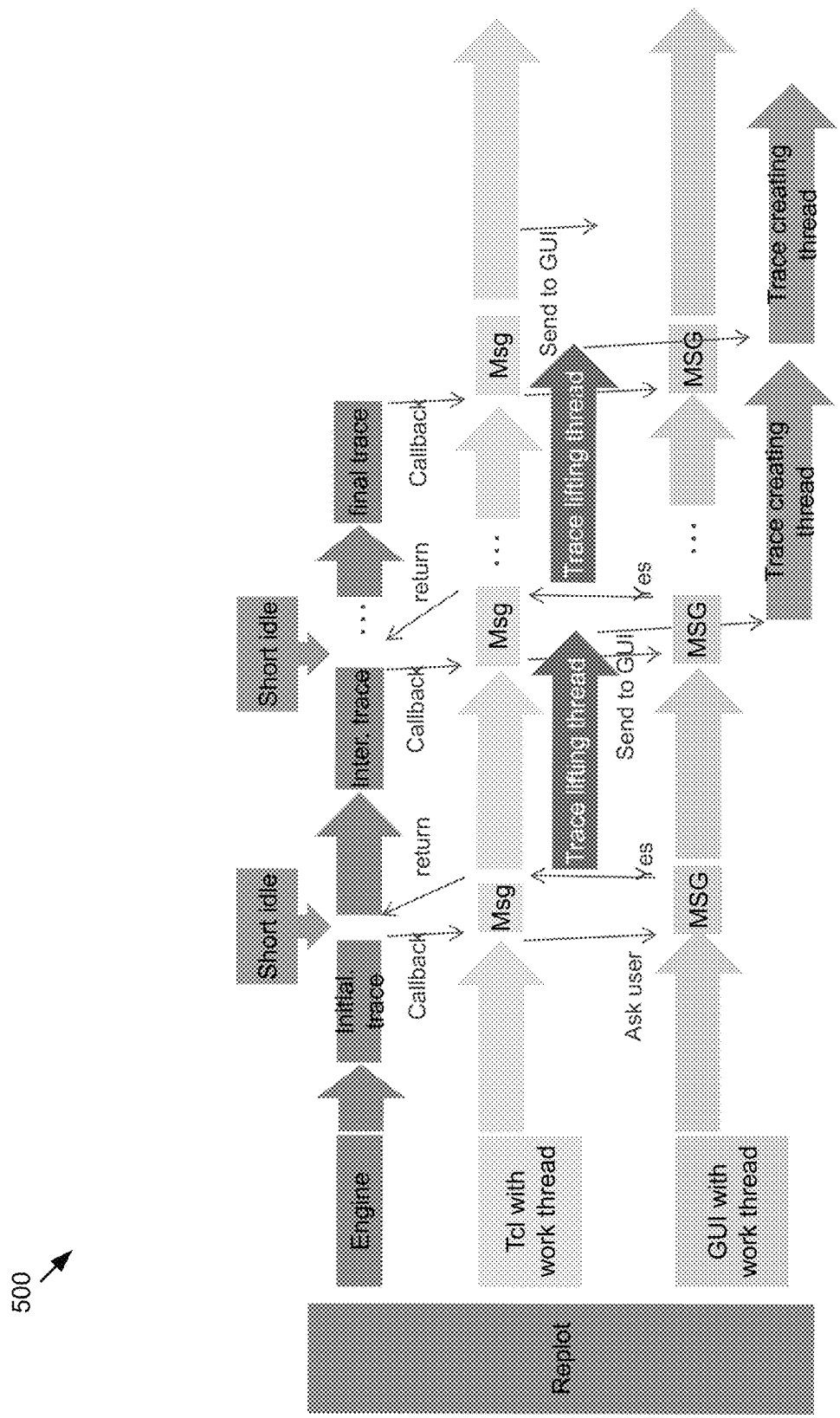
FIG. 5 is a diagram depicting an embodiment in accordance with the present disclosure.

In contrast, and referring now to FIG. 5, a diagram 500 consistent with debugging display process 10 is provided. In this example, the user is allowed access to initial and/or intermediate traces if desired. In operation, the formal engine may not be blocked by the Tcl thread when the Tcl thread is performing trace lifting. The graphical user interface may use a work thread to create trace data and it may respond with a trace ready message. It should be noted that overall formal engine performance is not impacted by trace lifting. As is discussed in further detail hereinbelow, the user may receive a message regarding the availability of the initial/intermediate traces. The notification system may allow the user to request bringing these traces to the debugging environment prior to the final trace being available.

In some embodiments, the plurality of traces may come from a quiet trace process such as those discussed herein. The plurality of traces may include an initial trace, at least one intermediate trace, and a final trace, all satisfying the same requirements that were sent to the formal engine. However, in some cases these may include different levels of quietness. In some embodiments, only one intermediate trace may be picked and kept from the list of intermediate traces, which has the most quietness among the intermediate traces.

In some embodiments, the plurality of traces may come from the deep bug hunting (DBH) process. A deep bug hunting process may refer to when the formal engines try to find a counter example or cover trace by using intermediate cover properties that help reach deeper states in the overall space state search, by chaining several cover traces together from different cover properties. This process may find traces which can't be found with typical formal techniques due to the very deep sequential length of these traces, but at the same time it is not guaranteed that any trace found is the shortest one possible, as is the case with classic formal engines. In this technique it is typical to find multiple traces for a single property since many different paths can be exercised and reach a valid counter example or cover trace.

In some embodiments, the plurality of traces may include an initial trace, at least one intermediate trace, and a final trace, all satisfying the same requirements that were sent to the formal engine. However, in some cases these may have different paths as determined by the deep bug hunting process. In some embodiments, only one intermediate trace may be picked and kept from the list of intermediate traces, which has the most activities among the intermediate traces.

Another embodiment of the present disclosure may receive traces from deep bug hunting mode of formal engines. In deep bug hunting mode, the formal engines may search different areas of the state space and each search may result in a different trace. The initial trace would be the first one that has been generated, while the final trace would be when the formal engines give up on looking for further trace based on some heuristics. In selecting one or more intermediate traces to keep, an embodiment of the grading criteria of the intermediate trace on the length of the traces (keep the longest and shortest) and on the activity density of the traces (keep the busiest since it has higher coverage on activities)

Figure 6:
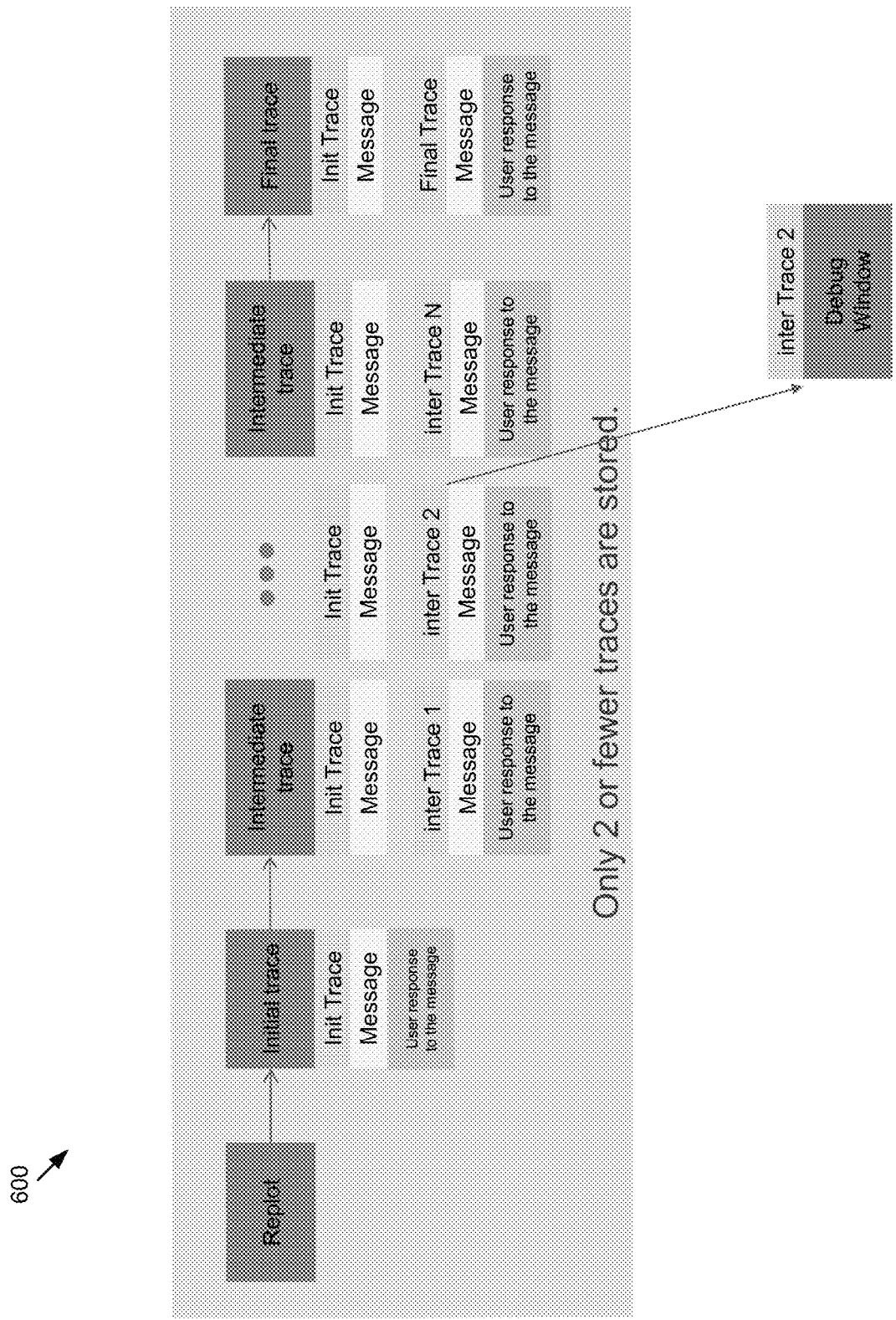
FIG. 6 is a diagram depicting an embodiment in accordance with the present disclosure.

Referring now to FIG. 6, a diagram 600 consistent with debugging display process 10 is provided. Debugging display process 10 may be configured to avoid storing massive amounts of traces during optimization. In this particular example, only one intermediate trace is stored, while others were overwritten. Intermediate trace 1 disappeared and is not accessible. Intermediate trace 2 was pulled into a debugging window (e.g. graphical user interface) and is therefore persistently available to the user. When the formal engine has completed the initial trace and the final trace may also be available to be pulled into one or more debugging windows.

Figure 7:
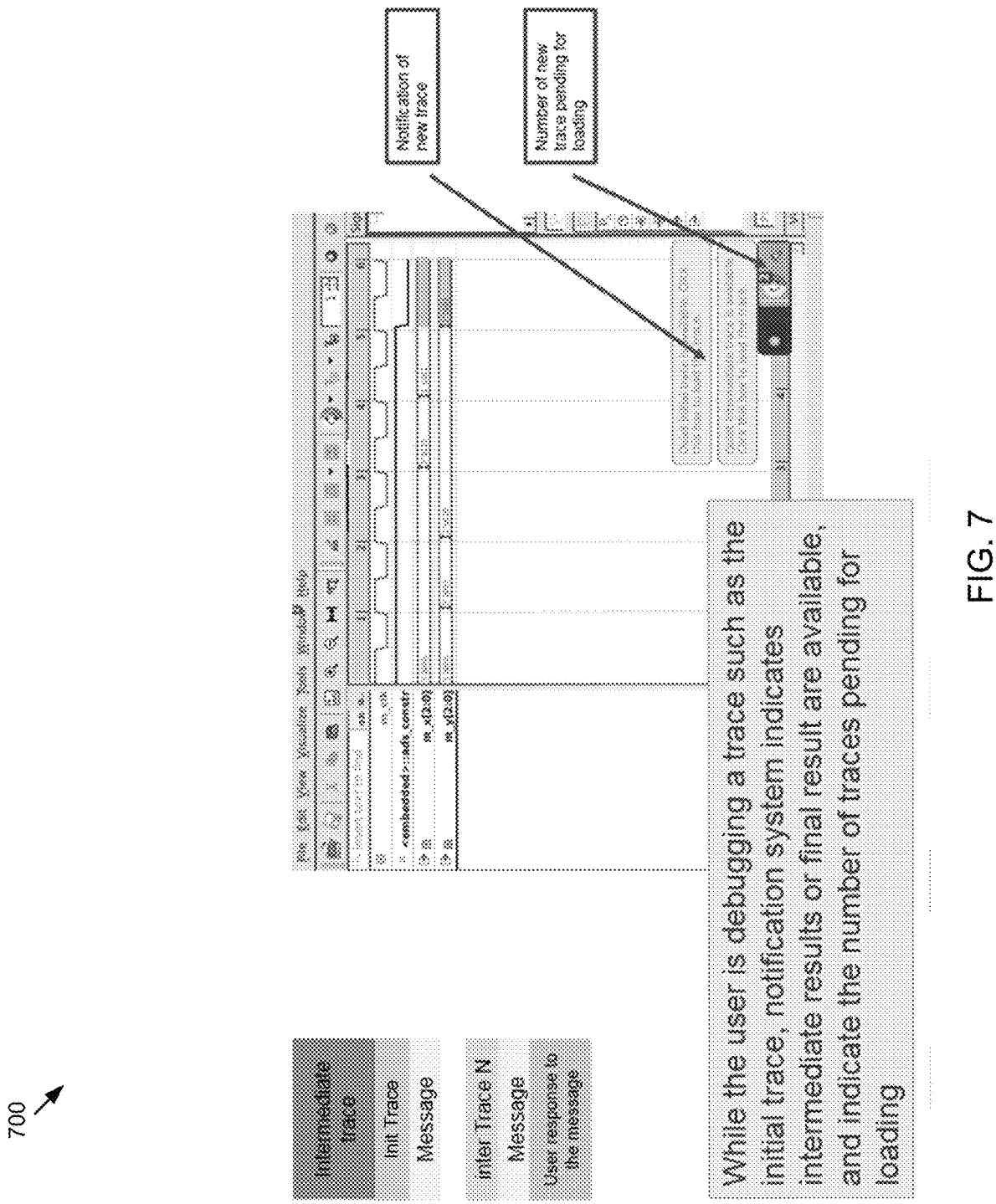
FIG. 7 is a graphical user interface depicting an embodiment in accordance with the present disclosure.
Figure 8:
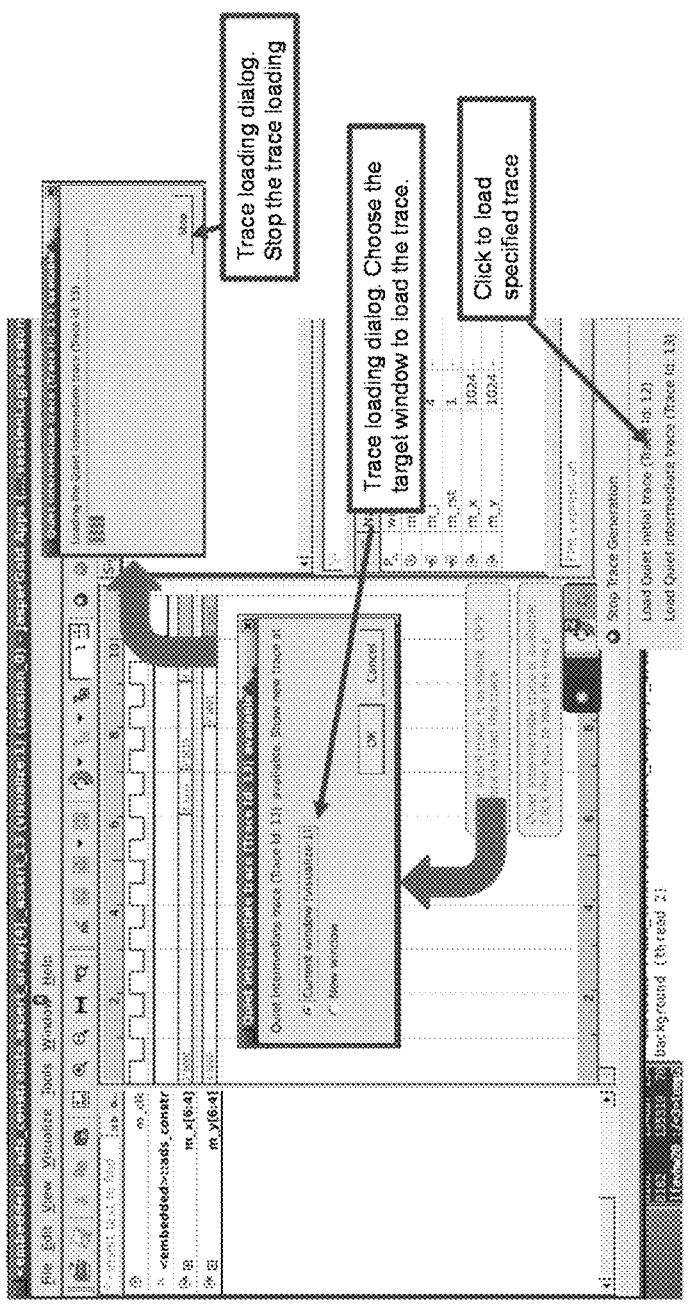
FIG. 8 is a graphical user interface depicting an embodiment in accordance with the present disclosure.
Figure 8:
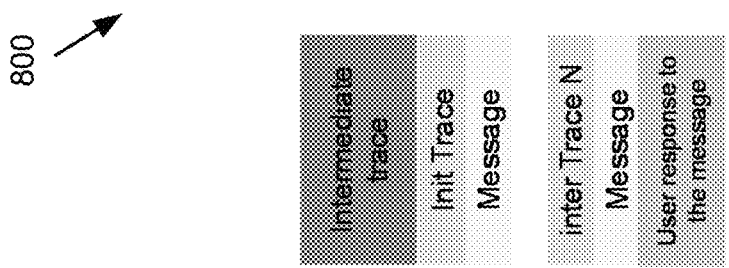

Referring now to FIGS. 7-8, graphical user interfaces 700 and 800 consistent with debugging display process 10 is provided. As shown in FIG. 7, debugging display process 10 may be configured to generate a navigation system configured to provide easy access for partially optimized traces within a debugging environment, which may include one or more graphical user interfaces In operation, while the user may be debugging a trace such as the initial trace, debugging display process 10 may indicate that intermediate results or final results are available, and indicate the number of traces pending for loading. A pop-up display or any suitable mechanism may be used to alert the user as to the presence of this information. FIG. 8 shows that the user may be provided with a choice of opening the intermediate traces or final trace in a current debugging window or a new debugging window. Additionally and/or alternatively, debugging display process 10 may provide the user with an option of selecting a specified trace to load. After the selection the user may also be provided with an option to stop the trace from loading as shown in FIG. 8.

Figure 9:
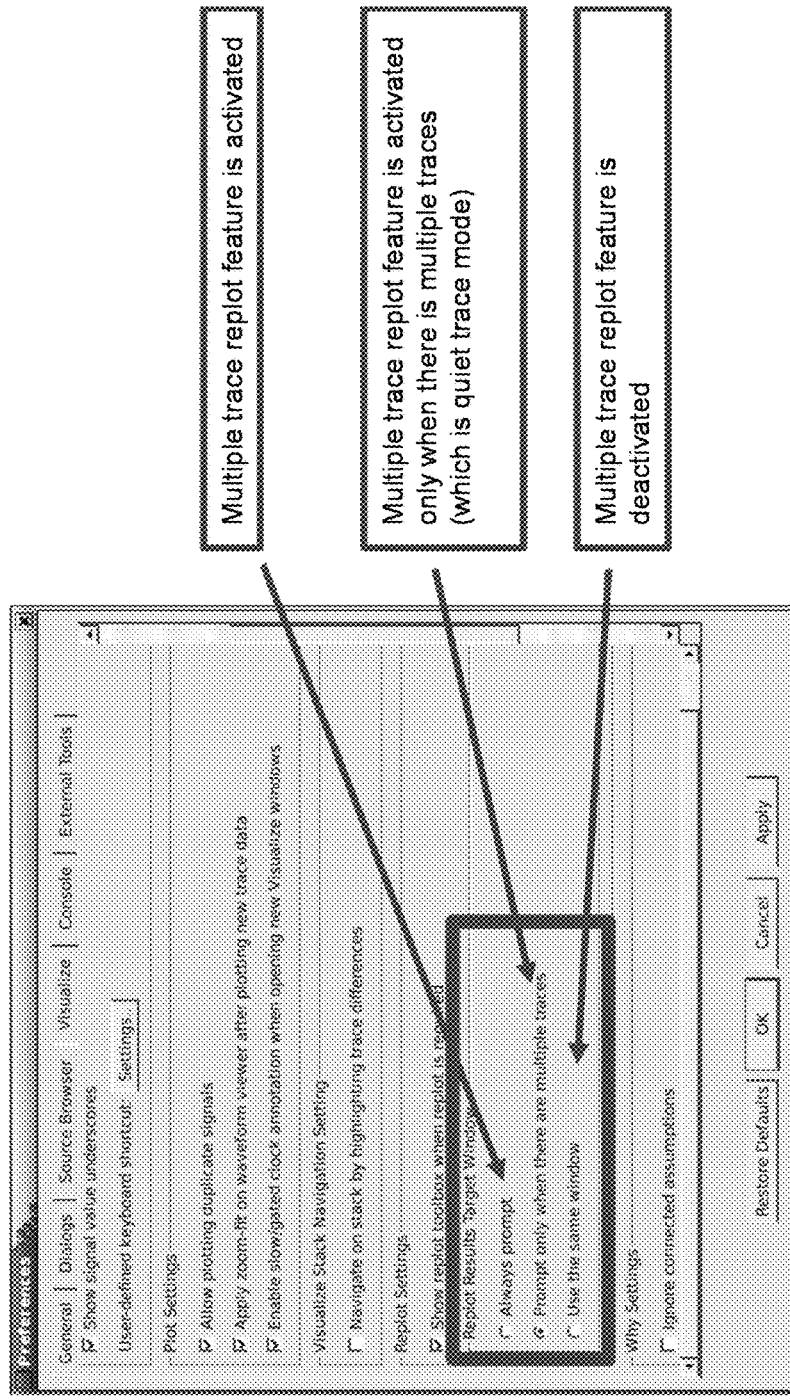
FIG. 9 is a graphical user interface depicting an embodiment in accordance with the present disclosure.

Referring now to FIG. 9, a graphical user interface 900 consistent with debugging display process 10 is provided. Debugging display process 10 may be configured to enable or disable a multiple trace replot feature. Some options may include, but are not limited to, activating the multiple trace replot feature, activating the feature only when there are multiple traces (e.g., during a quiet trace mode), and/or deactivating the feature.

Figure 10:
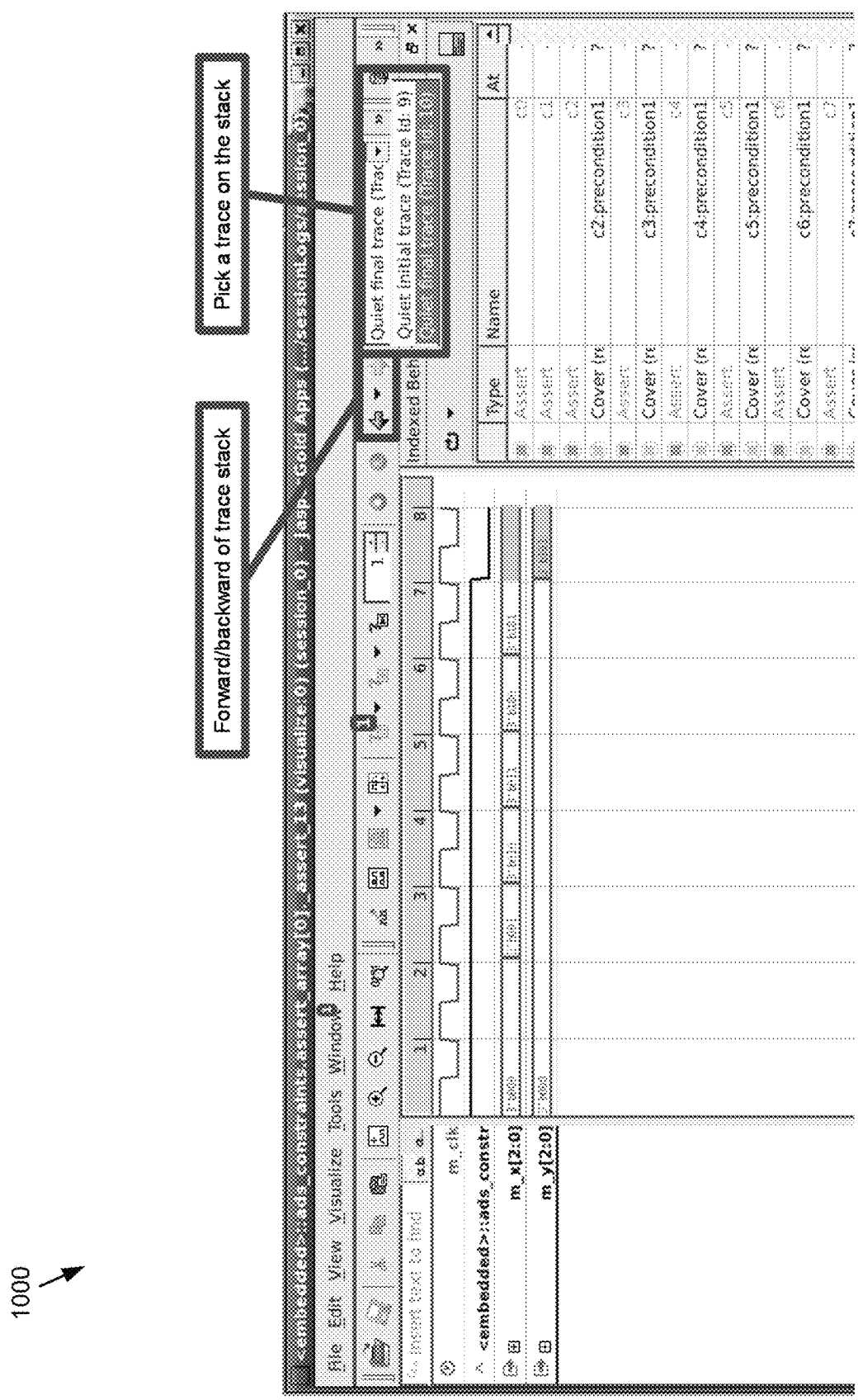
FIG. 10 is a graphical user interface depicting an embodiment in accordance with the present disclosure.

Referring now to FIG. 10, a graphical user interface 1000 consistent with debugging display process 10 is provided. Debugging display process 10 may be configured to allow a user to navigate through a plurality of trace in the same replot result. For example, and as shown, the user may select an option to move forward or backward through a trace stack and may also have the option of selecting a particular trace.

Figure 11:
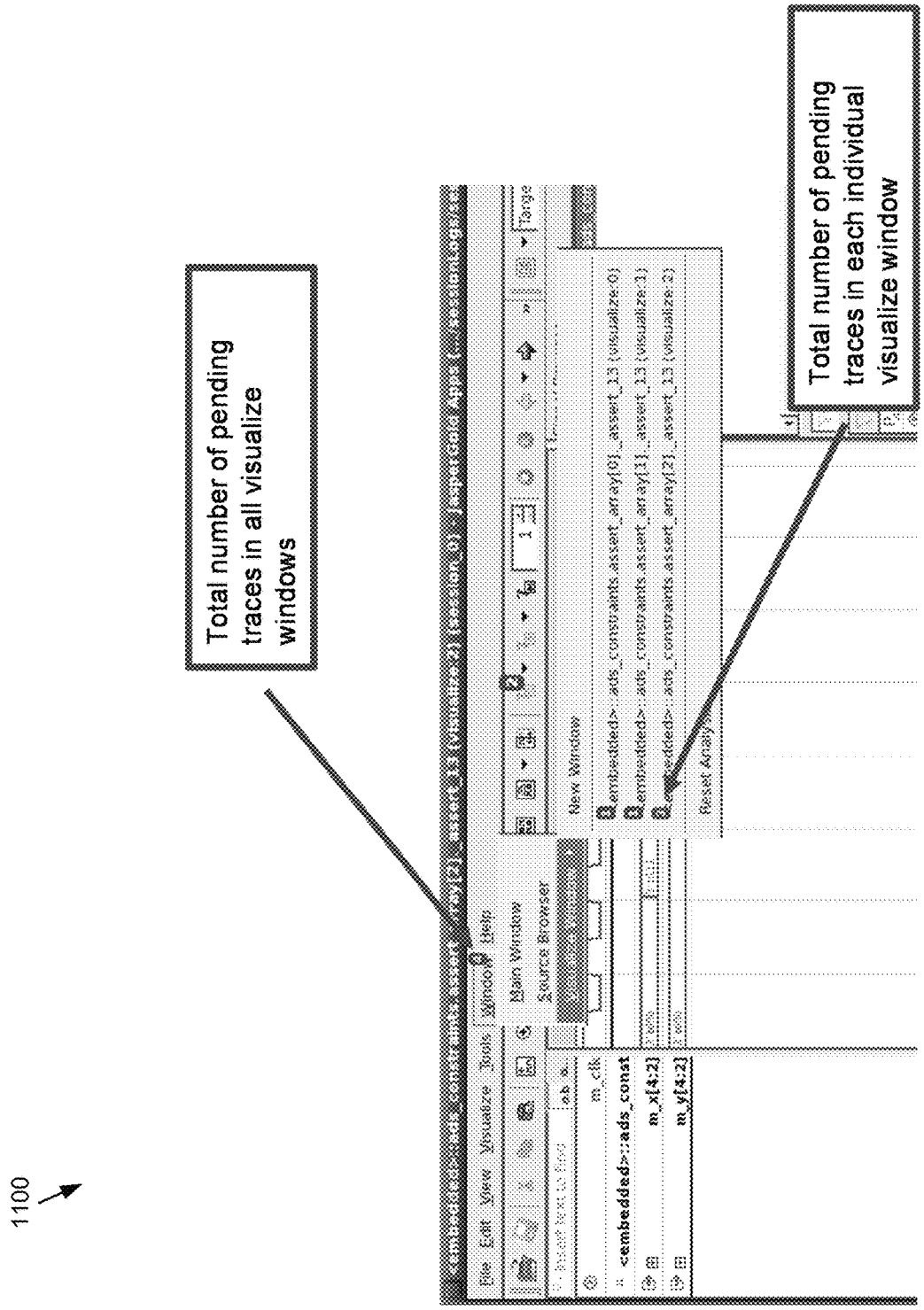
FIG. 11 is a graphical user interface depicting an embodiment in accordance with the present disclosure.

Referring now to FIG. 11, a graphical user interface 1100 consistent with debugging display process 10 is provided. Debugging display process 10 may be configured to display the status of some or all of the pending traces in GUI 1100. This may include, but is not limited to, the total number of pending traces in all windows and/or the total number of pending traces in each window.

Figure 12:
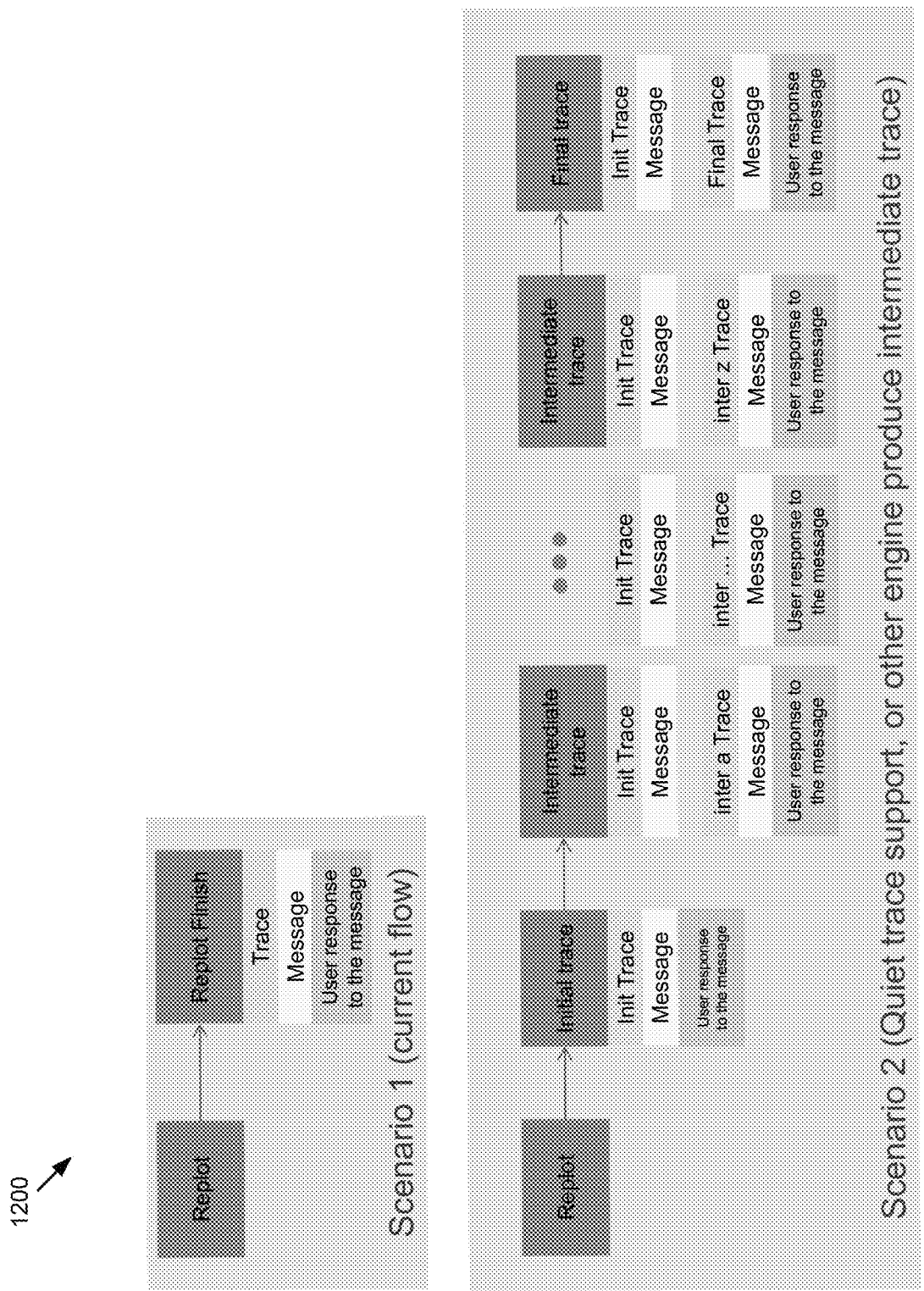
FIG. 12 is a diagram depicting an embodiment in accordance with the present disclosure.

Referring now to FIGS. 12-13, diagrams 1200 and 1300 depict a comparison between existing approaches and the teachings of the present disclosure. The first scenario depicts an existing approach and the second scenario shows an example with quiet trace support or another engine produces an intermediate trace. The final scenario shown in FIG. 13 shows an example consistent with debugging display process 10.

As discussed herein, debugging display process 10 may provide a number of features. For example, using the teachings of the present disclosure a user may now open multiple traces generated by a formal engine during replot (e.g., "initial trace", "final trace" and "intermediate traces"). A graphical user interface may notify the user when an intermediate trace is generated by engine. In some embodiments, the user may load the intermediate trace while the replot is still ongoing and/or may ignore the intermediate trace if the user is not interested in it. Additionally and/or alternatively, the user may monitor the pending intermediate trace for loading in all visualize windows and the system may also allow the user navigate between different loaded intermediate traces.

In some embodiments, intermediate traces may override each other based on the quietness of the traces from the quiet trace operation (or other ranking criteria in other embodiments). In this way, debugging display process 10 may allow for constant memory usage instead of linear. In operation, the user may gain access to earlier traces while optimization continues to execute in background. Accordingly, the user does not have to wait long to get something to debug. In some cases, the graphical user interface may be configured to notify the user when new traces are generated with at most one intermediate trace, while they continue to have access to the current trace.

In some embodiments, one or more traces may be received from a trace minimizer. A trace minimizer engine typically receives a trace and generates one or more shorter traces that solve the same problem statement that was used to generate the provided trace. Some embodiments may use the provided trace as the initial trace, and shorter traces as the intermediate traces, with the final trace being the shortest possible trace that could be found. The selection of one or more intermediate traces to keep in this embodiment is to let shorter intermediate traces overwrite longer intermediate traces.

Embodiments of debugging display process 10 may provide numerous advantages over existing approaches. Some of these may include, but are not limited to, providing a non-intrusive notification system for multiple trace results, enabling a quick turnaround time for debugging, allowing users to see results that were hidden from them before, providing improved usability as while the proof is running the user may continue debugging the currently open trace without having to worry about the final trace overwriting the current debug session, providing for storage of multiple results in a database so that users can navigate through them, trace viewing does not impact the proof performance as it happens on a separate thread, the user can open the traces in a new window instead of the current one from where the process has been dispatched, etc.

It will be apparent to those skilled in the art that various modifications and variations can be made in the embodiments of the present disclosure without departing from the spirit or scope of the present disclosure. Thus, it is intended that embodiments of the present disclosure cover the modifications and variations provided they come within the scope of the appended claims and their equivalents.

What is claimed is:

1. A computer-implemented method comprising:
   receiving, using a processor, an electronic design;
   performing formal verification upon at least a portion of the electronic design for a specific problem statement;
   generating a plurality of traces associated with the formal verification satisfying the specific problem statement;
   allowing a user to browse, at a graphical user interface, the plurality of traces; and
   displaying, at a graphical user interface, an option to select at least one of from the plurality of traces for display and debugging at the graphical user interface while the formal verification is performed.

2. The computer-implemented method of claim 1 further comprising:
   providing, at the graphical user interface, a notification of a new trace during the formal verification.

3. The computer-implemented method of claim 2 further comprising:
   allowing a user to select the new trace for display during the formal verification.

4. The computer-implemented method of claim 1 wherein the plurality of traces may include a quiet trace, and wherein the plurality of traces includes an initial trace, at least one intermediate trace, and a final trace, all satisfying one or more requirements that were initially provided to a formal engine, each of the plurality of traces having different levels of quietness.

5. The computer-implemented method of claim 3 further comprising:
   allowing a user to select between multiple portions of the graphical user interface to display the new trace.

6. The computer-implemented method of claim 4 further comprising:
   selecting one intermediate trace; and
   storing the one intermediate trace while overwriting one or more remaining intermediate traces.

7. The computer-implemented method claim 4 further comprising:
   storing the plurality of traces using one or more databases.

8. The computer-implemented method claim 3 further comprising:
   displaying a selected trace without altering a current proof associated with the formal verification.

9. A non-transitory computer-readable storage medium having stored thereon instructions that when executed by a machine result in the following operations:
   receiving, using a processor, an electronic design;
   performing formal verification upon at least a portion of the electronic design for a specific problem statement;

generating a plurality of traces associated with the formal verification satisfying the specific problem statement;

displaying, at a graphical user interface, an option to select at least one of the plurality of traces for display at the graphical user interface while the formal verification is performed and prior to generating all traces associated with the formal verification.

10. The computer-readable storage medium of claim 9 further comprising:

providing, at the graphical user interface, a notification of a new trace during the formal verification.

11. The computer-readable storage medium of claim 10 further comprising:

allowing a user to select the new trace for display during the formal verification.

12. The computer-readable storage medium of claim 9 wherein the plurality of traces may include a quiet trace, and wherein the plurality of traces includes an initial trace, at least one intermediate trace, and a final trace, all satisfying one or more requirements that were initially provided to a formal engine, each of the plurality of traces having different levels of quietness.

13. The computer-readable storage medium of claim 11 further comprising:

allowing a user to select between multiple portions of the graphical user interface to display the new trace.

14. The computer-readable storage medium of claim 12 further comprising:

selecting one intermediate trace; and storing the one intermediate trace while overwriting one or more remaining intermediate traces.

15. The computer-readable storage medium of claim 12 further comprising:

storing the plurality of traces using one or more databases.

16. The computer-readable storage medium of claim 11 further comprising:

displaying a selected trace without altering a current proof associated with the formal verification.

17. A system comprising:

a computing device having at least one processor configured to receive an electronic design and to perform formal verification upon at least a portion of the electronic design for a specific problem statement, the at least one processor further configured to generate a plurality of traces associated with the formal verification satisfying the specific problem statement, the at least one processor further configured to display, at a graphical user interface, an option to select at least one of the plurality of traces for display at the graphical user interface while the formal verification is performed and prior to outputting final results from formal verification.

18. The system of claim 17 wherein the at least one processor is further configured to provide, at the graphical user interface, a notification of a new trace during the formal verification.

19. The system of claim 18 wherein the at least one processor is further configured to allow a user to select the new trace for display during the formal verification.

20. The system of claim 17 wherein the plurality of traces may include a quiet trace, and wherein the plurality of traces includes an initial trace, at least one intermediate trace, and a final trace, all satisfying one or more requirements that were initially provided to a formal engine, each of the plurality of traces having different levels of quietness.

* * * * *